(12) United States Patent
Lee

(10) Patent No.: US 6,572,388 B2
(45) Date of Patent: Jun. 3, 2003

(54) SOCKET FOR TESTING IC PACKAGE

(75) Inventor: Sang-Hun Lee, Seoul (KR)

(73) Assignee: Wooyoung Co. Ltd., Seoul (KR)

( * ) Notice: Subject to any disclaimer, the term of this patent is extended or adjusted under 35 U.S.C. 154(b) by 0 days.

(21) Appl. No.: 09/916,703

(22) Filed: Jul. 26, 2001

(65) Prior Publication Data

US 2002/0045365 A1 Apr. 18, 2002

(30) Foreign Application Priority Data

Oct. 12, 2000 (KR) ......................................... 2000-60006

(51) Int. Cl.⁷ ............................................... H01R 12/00
(52) U.S. Cl. ........................................... 439/71; 439/66
(58) Field of Search ....................... 439/66, 68, 70–74, 439/591

(56) References Cited

U.S. PATENT DOCUMENTS 4,445,735 A    5/1984   Bonnefoy
5,069,629 A   12/1991   Johnson
5,749,738 A *  5/1998   Johnson et al. ............... 439/66

* cited by examiner

Primary Examiner—Lynn D. Feild
Assistant Examiner—Son V. Nguyen
(74) Attorney, Agent, or Firm—Akin, Gump, Strauss, Hauer & Feld, L.L.P.

(57) ABSTRACT

The present invention relates to a socket for testing an integrated circuit utilizing an improved contact pin structure. In the test socket of the present invention, the length of the electrical path between the leads of tested IC and terminals of PCB is minimized and the contact pin may maintain wiping action in a wide area of contact portions. Further, as the contact pin may accommodate the pressure applied by the IC leads with great elasticity and provides sufficient floating suspension when the pressure is removed, the invention may efficiently prevent damages to the leads of IC being tested and extend the life of the contact pin.

8 Claims, 5 Drawing Sheets

ELASTIC BODY

SOCKET FOR TESTING IC PACKAGE

TECHNICAL FIELD

The invention relates generally to a socket for testing an integrated circuit package. More particularly, the invention relates to a socket utilizing an improved contact pin structure which is able to reduce the electrical connection length between a to-be tested subject and a PCB to improve the high-frequency characteristic and has capability to maintain good electrical contact and extend the life of the socket.

BACKGROUND OF THE INVENTION

Generally, an integrated circuit (IC) package is subjected to a test of its electrical characteristic using an open-top type socket for a handler or a manual socket of a Calm type. For this test, the socket is mounted on a printed circuit board (PCB) connected to measurement equipments. The IC circuit package is mounted on the socket. At this time, an electrical connection element, such as a contact pin is required for connecting the leads of the IC package to the terminals of the PCB.

In order to design a contact pin performing this function, the following four requirements should be considered. First, it should maintain good contact be with the tested subject. For this, the contact portion of the contact pin should maintain contact with the IC package while performing a wiping action. Second, it is required that the length of the electrical connection between contact points should be short as possible. In particular, when the contact pin is used to perform a high-frequency IC test, a long length of electrical connection may act as an impedance since the inductance of the contact pin becomes larger. Third, the contact pin should not cause any bending of an IC lead during the test. Bending of an IC lead during the test substantially degrades the yield of the IC. Fourth, the contact pin and the elastic members supporting them should have a long life. If any of the contact pins fails, the entire test socket should be replaced.

Various structures of contact pins in consideration of these requirements have been developed and used. FIGS. 1~3 are cross-sectional views of conventional contact pin structures mounted on a conventional socket according to their respective use.

The contact pin shown in FIG. 1 is so called Yamaichi socket pin, which is widely used in integrated circuit tester sockets. The Yamaichi socket pin, however, has the following disadvantages in view of the above four requirements. First, when a lead 12 of an IC 11 is pressed against the contact pin 10, some degree of wiping action is caused at a potion contacting a PCB terminal 13. As can be seen clearly from FIG. 1, the rotational radius of the contact portion of the terminal is short since a rotational axis of the contact pin 10 is very near to the PCB. Thus, it is difficult to perform wiping action in a wide area. Second, as the contact points of the integrated circuit lead 12 and the PCB terminal 13 are not aligned in a straight line and they are connected to each other via detouring path, there is a problem that the electrical length becomes longer. Third, when the pressure applied by the lead 12 of the integrated circuit 11, the floating suspension of the contact pin 10 is relatively small. Thus, when pressure is applied for test, the integrated circuit lead 12 may be bent since a great force is directly applied to the integrated circuit leas 12.

U.S. Pat. No. 4,445,735 was contrived to solve the problem of the Yamaichi socket pin. (see FIG. 2). However, this invention also has some limitations. First, it has a long electrical length. When pressure is applied, the integrated circuit lead can be bent since the floating suspension provided by the contact pin 20 when pressure is removed is limited. Thus, this invention achieves little improvement over the Yamaichi socket pin.

U.S. Pat. No. 5,069,629 illustrates improved electrical connection device over the Yamaichi socket pin or U.S. Pat. No. 4,445,735, the cross-sectional view of which is shown in FIG. 3. As can been seen from FIG. 3, the contact pin 30 of U.S. Pat. No. 5,069,629 has a structure in which contact points are aligned in a straight line to reduce the electrical length between the contact points. However, as the structure of the contact pin has a generally S-shape, it has a significant limitation in reducing the horizontal length of the contact portion. Thus, this structure is not able to minimize the electrical length. Also, as the displacement of the contact point on the side of the lead 32 of an integrated circuit 31 and that of the contact point on the PCB terminal 33 side are symmetric, if the contact point on the integrated circuit lead 31 has a downward displacement, displacement of the contact point on the side of the PCB terminal 33 should be upward. Also, axial axes of respective contact points are not same and have short rotation radius. Thus, although the contact pin structure provides some degree of wiping action, its wiping distance is very short.

SUMMARY OF THE INVENTION

It is therefore an object of the present invention to provide a socket for testing an integrated circuit using a contact pin structure which has a very short electrical length between the contact points, and does not cause bending of an integrated circuit lead during test, and which is able to maintain good contact state with the test subject and extend the life of the device.

In order to accomplish the above objects, the present invention proposes a socket for testing an integrated circuit including a plurality of contact pins for electrically connecting leads of an integrated circuit to terminals of a PCB spaced from the leads of the integrated circuit, being characterized by comprising a contact pin housing installed on said PCB for mounting said integrated circuit, said contact pin housing having a flat top surface and a flat bottom surface; a plurality of slots formed on both sides of the contact pin housing to pass through the contact pin housing from the top surface to the bottom surface and having a size adequate to accommodate the contact pins; a first channel and formed on both sides of the contact pin housing and a second channel formed in parallel to said first channel and on the outer side of the respective first channel, the channels being formed from the bottom surface of the contact pin housing and extending to cross all of the slots; a first elastic member and a second elastic member respectively installed within the first channel and the second channel, wherein the contact pins are inserted into the respective slots, and each of the contact pin engages with the first and second elastic members, and each of the contact pins includes a first contact portion protruding over the top surface of the contact pin housing for making contact with a lead of the integrated circuit and a second contact portion for making contact with one of the terminal of the PCB.

Also, the contact pin of the present invention is made of a thin and flat metal piece, said contact pin is characterized by including a first elastic member receiving portion having a circular circumferential face which is open toward and engage with the first elastic member when the contact pin is inserted into the slot; a second elastic member receiving portion having a circular circumferential face which is open toward and engage with the second elastic member when the contact pin is inserted into said slot, and said contact pin is further characterized in that the first elastic member receiving portion and the second elastic member receiving portion are formed on a upper side of the contact pin facing said first and second elastic members when the contact pin is inserted into the slot and the second elastic member is formed at a location opposing said first elastic member with respect to the center of the contact pin; and the first contact portion extends from the outer side of the first elastic member receiving portion with respect to the center of the contact pin and extends generally in a upward direction with respect to the upper side of the contact pin; and the second contact portion is formed on a bottom side of the upper side of the contact pin and at a location generally below the center of the contact pin.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1:
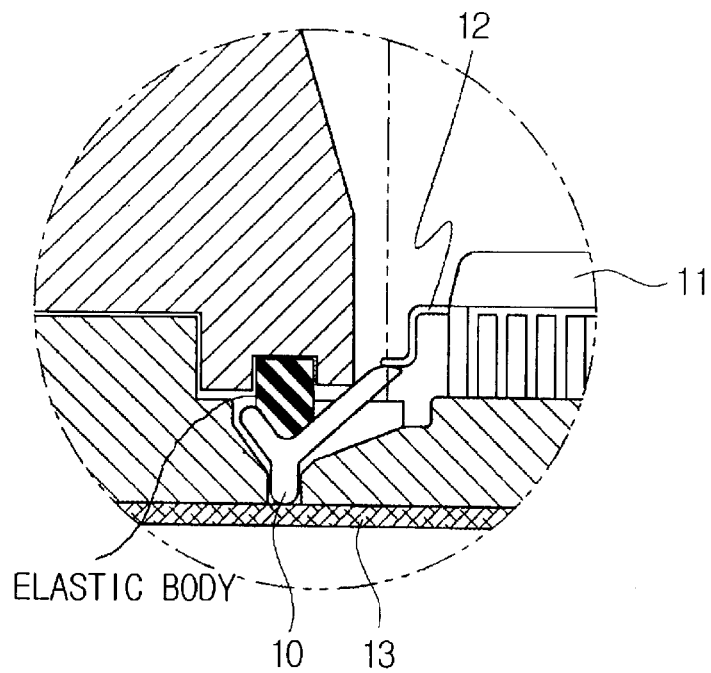
FIG. 1 illustrates a cross-sectional view of a major part of a conventional socket.
Figure 2:
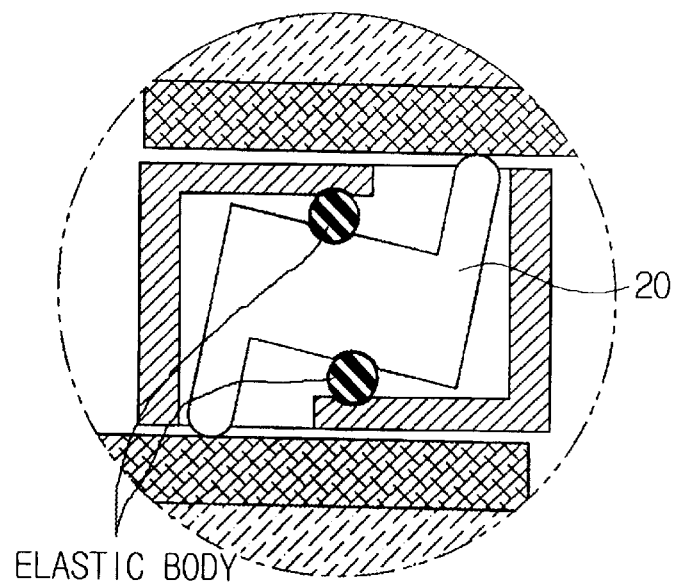
FIG. 2 illustrates a cross-sectional view of another conventional socket.
Figure 3:
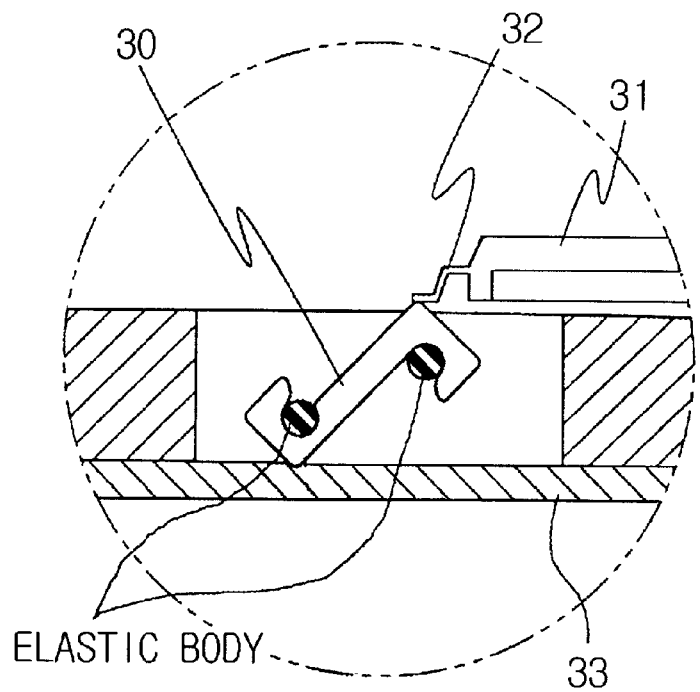
FIG. 3 illustrates a cross-sectional view of a still another conventional socket.

The present invention will be described in detail by way of a preferred embodiment with reference to accompanying drawings, in which like reference numerals are used to identify the same or similar parts.

Figure 4:
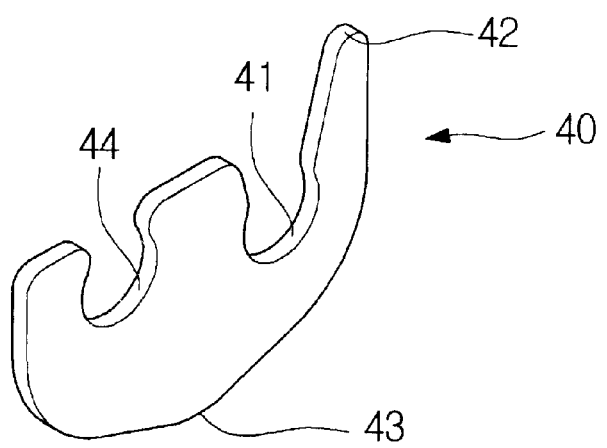
FIG. 4 is a perspective view of one type of a contact pin to be mounted on a socket according to the present invention.
Figure 5:
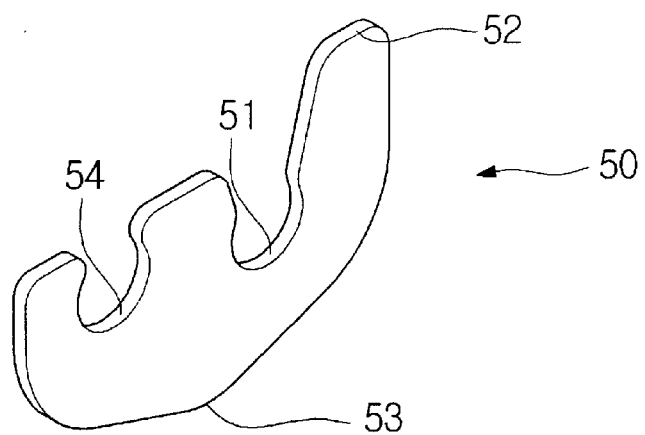
FIG. 5 is a perspective view of another type of a contact pin to be mounted on a socket according to the present invention.
Figure 6:
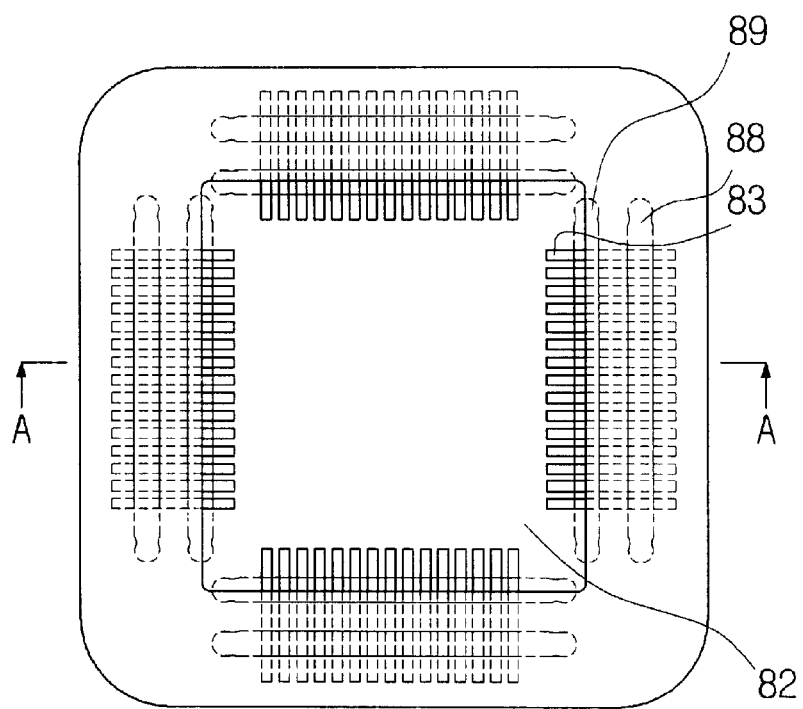
FIG. 6 shows a plane view of a contact pin housing used in a socket according to the present invention.
Figure 7:
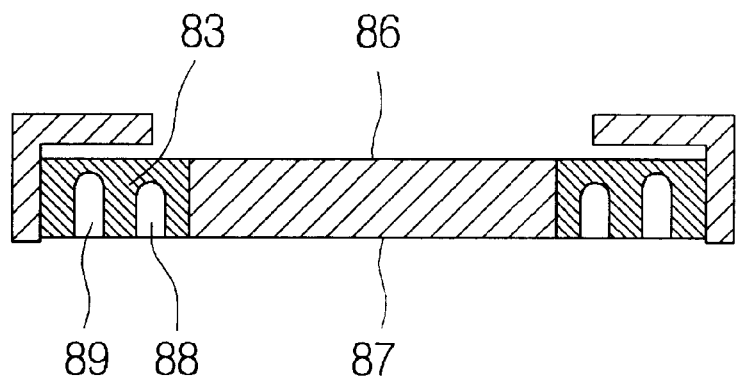
FIG. 7 is a cross-sectional view taken along "A–A" of the contact pin housing in FIG. 6.
Figure 8:
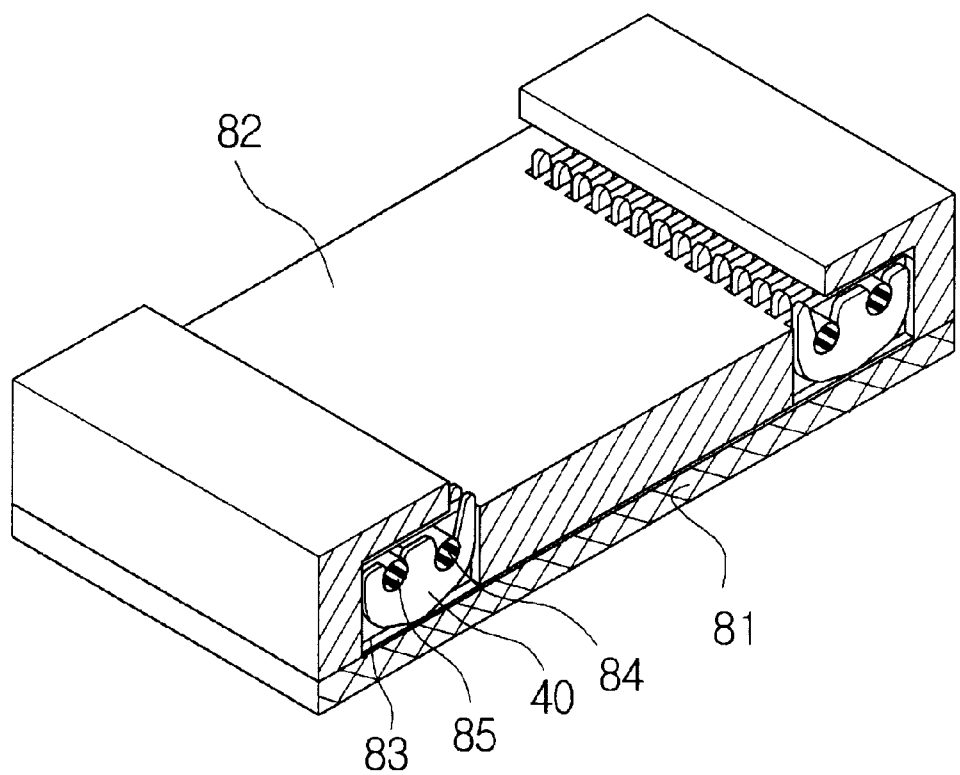
FIG. 8 is a perspective view illustrating a contact pin mounted on a contact pin housing of a socket according to the present invention.
Figure 9:
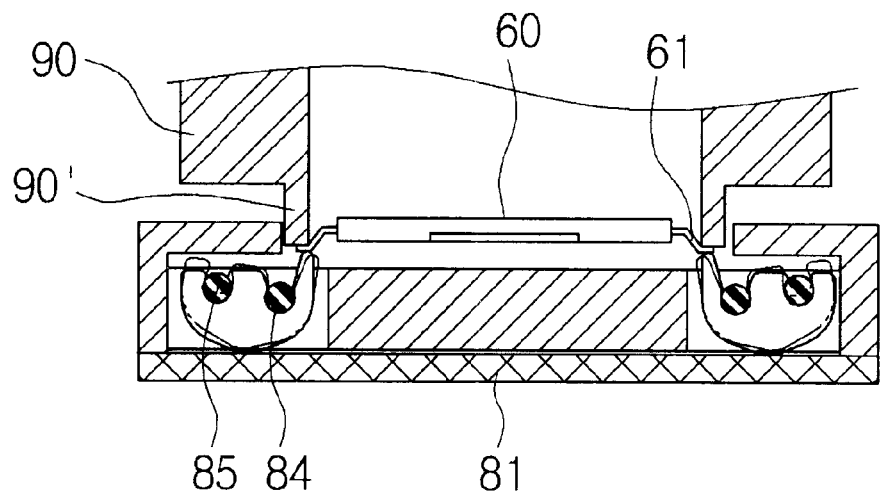
FIG. 9 is a cross-sectional view illustrating a state that one type of an integrated circuit is mounted on a socket according to the present invention and the actuator of the socket is closed.
Figure 10:
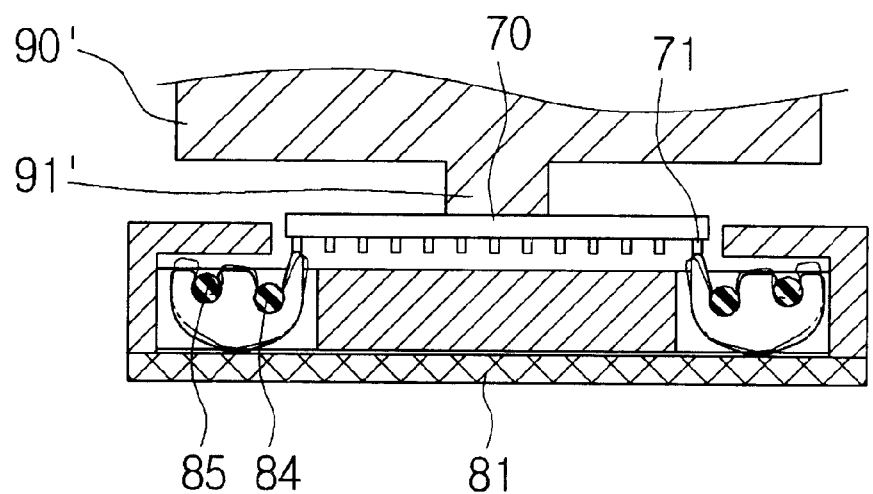
FIG. 10 is a cross-sectional view illustrating a state that another type of an integrated circuit is mounted on a socket according to the present invention and the actuator of the socket is closed.

FIG. 4 is an enlarged perspective view of one type of a contact pin to be mounted on a socket according to the present invention. FIG. 5 is an enlarged perspective view of another type of a contact pin to be mounted on a socket according to the present invention. FIG. 6 shows a plane view of a contact pin housing used in a socket according to the present invention. FIG. 7 is a cross-sectional view taken along "A–A" of the contact pin housing in FIG. 6. FIG. 8 is a perspective view illustrating a contact pin mounted on a contact pin housing of a socket according to the present invention. FIG. 9 is a cross-sectional view illustrating a state that one type of an integrated circuit is mounted on a socket according to the present invention and the actuator of the socket is closed. FIG. 10 is a cross-sectional view illustrating a state that another type of an integrated circuit is mounted on a socket according to the present invention and the actuator of the socket is closed.

As shown particularly in FIGS. 4 and 5, a contact pin 40, 50 includes a first elastic member receiving portion 41, 51 having a circular circumferential face, which is formed on one side (right side in FIGS. 4 and 5) of a thin and flat metal piece 45, 55. The first elastic member receiving portion 41, 51 is open toward the upward direction to engage with a first elastic member 84 as illustrated particularly in FIGS. 8 to 10. The contact pin 40, 50 further includes a first contact portion 42, 52 which extends generally in an upward direction from an outer side of the contact pin, and particularly from the outer side of the first elastic member receiving portion 41, 51. The first contact portion 42, 52 has a generally tapered shape and extends higher than the tip of the thin and flat metal piece 45, 55. The contact pin 50 in FIG. 5 differs from the contact pin 40 in FIG. 4 in that its first contact portion 52 is wider than that of the contact pin in FIG. 4. The width of the first contact portion may be adequately adjusted according the purpose of use within the principle of the present invention. As shown in FIGS. 9 and 10, the first contact portion makes contact with a contact lead 61, 71 of an integrated circuit 60, 70 when the integrated circuit is mounted on the socket.

The contact pin 40, 50 also includes a second elastic member receiving portion 44, 54 which is formed on the upper side on the contact pin and on a side (left side in FIGS. 4 and 5) opposing the first elastic member receiving portion 41, 51. A metal piece 45, 55 located between the first and the second elastic member receiving portions and at a location generally over the center of the contact pin. On the bottom side of the contact pin, a second contact portion 43, 53 is formed at a location generally below the thin and flat metal piece 45, 55. As shown in FIGS. 810, the second contact portion 43, 53 contacts a terminal of a PCB terminal 81 when the contact pin is installed in the socket.

Further, the upper tip of the first contact portion 42, 52 of the contact pin 40, 50 extends higher than the upper side of the contact pin where the first and the second elastic member receiving portions are formed. The first elastic member receiving portion 41, 51 has a shape gradually widening toward the upper direction. The second contact portion 43, 53 have a curved shape protruding downward to perform a wiping action with the PCB terminal 81 in a wide area.

A first and a second elastic members 84, 85 are respectively inserted in a first channel 88 and a second channels 89 of a contact pin housing 82 shown in FIG. 7. When mounting a contact pin in the housing 82, as shown in FIGS. 8 to 10, the first elastic member 84 is inserted into the first elastic member receiving portion 41, 51 and the second elastic member 85 is inserted into the second elastic member receiving portion 44, 54, respectively. In this state, the first contact portion 42, 52 of the contact pins 40, 50 protrudes out of the top 86 of the contact pin housing 82 and the second contact portion 43, 53 is biased toward the bottom 87 of the contact pin housing 82 due to the elastic force applied by the elastic members. Thus, the first and the second contact portions can easily contact the lead 61, 71 of the integrated circuits 60, 70 and the PCB terminal 81, respectively. Then, the first and second elastic member receiving portions are formed to have a circular shape greater than a half semicircle so that they may not be easily disengaged from the first and second elastic members 84, 85 when they are once engaged with each other.

In designing a contact pin of the above structure, the following requirements should be considered.

First, when an integrated circuit is mounted so that the leads 61, 71 of the integrated circuit contact with the first contact portion 42, 52 of the contact pins 40, 50 and pressure is applied to the leads 61, 71 by means of an actuator of a socket, the contact pins 40, 50 are rotated centering around the centers of the first and second elastic member receiving portions 42, 52, 43, 53, which allows the first contact portion 42, 52 and the second contact portion 43, 53 respectively make contact with the leads 61,71 of the integrated circuit and the PCB terminal 81 making a greater wiping action. As such, the present invention uses two rotational axes of the contact pins 40, 50 to maximize distance between the rotational axes and the contact portions and to secure sufficient wiping action of the contact portions.

Second, the present invention adopts a structure in which the electrical path between the first contact portion 42, 52 and the second contact portion 43, 53 is formed in a generally straight line and a horizontal and vertical distance between the contact portions is reduced as much as possible. Thus, the electrical length between the contact portions is minimized. Thus, the contact pin structure according to the present invention is suitable for a socket for high-frequency test of an integrated circuit.

Third, the free floating suspension of the contact pins 40, 50 when the pressure applied to the contact pins by the actuator is removed need to be sufficient in order to minimize the bending of the semiconductor leads 61, 71 during test. The present invention adopts a structure in which elasticity of the second elastic member 85 can be directly transferred to the contact portion by rotating the contact pin 40, 50 to secure a great free floating suspension of the socket.

Fourth, the present invention adopts a structure in which elasticity is applied to the contact pin 40, 50 while the contact pin rotates around the respective axes of the first elastic member receiving portion 41, 51 and the second elastic member receiving portion 44, 54. Thus the torsion that may deform the contact pin 40, 50 during repetitive tests is minimized. This structure not only extends the life of the contact pins 40, 50 but also extends the life of the socket.

FIG. 6 and FIG. 7 are a plane view and a cross-sectional view of the major parts of the contact pin housing 82 into which a plurality of the contact pins 40, 50 are accommodated. As can be seen from the drawing, the housing 82 has at least one slot into which the contact pin 40, 50 is inserted. Each slot penetrates from the top surface 86 to the bottom surface 87 of the housing 82. An aperture (hereinafter referred to 'channel') into which the first elastic member 84 and the second elastic member 85 are inserted is formed from the bottom surface 87 surface of the housing in a vertical direction. The channel extends through all of the slots 83, and the cross-section of the first second channels 88, 89 taken along the vertical direction has a generally ∩ shape, as shown in FIG. 7. Also, the depth of the of the first and second channels 88, 89 is made so that the first contact portion 42, 52 and the second contact portion 43, 53 of the contact pins 40, 50 adequately protrudes from of the top surface 86 and the bottom surface 87 of the housing, when the first elastic member 84 and the second elastic member 85 are respectively inserted into the first and second channels 88, 89 and the contact pins 40, 50 are installed in the housing as show in FIG. 8. Preferably, the second channel 89 is formed deeper than the first channel 88 so that they correspond to shapes of the first elastic member receiving portion 41, 51 and the second elastic member receiving portion 44, 54 of the contact pin 40, 50.

FIG. 8 is a partial perspective view and a partial cross-sectional view of a socket where a contact pin 40, a first elastic member 84 and a second elastic member 85 are installed in a contact pin housing 82, and the contact pin housing is mounted on a PCB. As can be seen from the drawing, in the contact pin housing 82, the first elastic member 84 is first installed into the first channel 88 and the second elastic member 85 is installed into the second channel 89. Then, the contact pin 40 is pushed from the bottom 87 to the top 86 of the slot 83, so that the first and second elastic member receiving portions 41, 42 of the contact pin 40 respectively engage with the first and second elastic members 84, 85.

Referring now to FIG. 9 and FIG. 10, a detailed operation of the contact pin 40 when the integrated circuit is mounted on the socket according to the present invention and the actuator of the socket is closed will be explained below.

FIG. 9 and FIG. 10 show a cover 90, 91 of the socket attached to an actuator (not shown). Inside the cover 90, 91, a cushion 90', 91' is attached to the cover. When the cover is closed over the socket, the cushions 91', 92 directly press the lead 61 of the integrated circuit 60 as shown in FIG. 9 or indirectly press the integrated circuit 70 as shown in FIG. 10. If the integrated circuit is mounted to the contact pin housing 82 and the actuator is closed to press the leads 61, 71 of the integrated circuits 60, 70 by means of the cushions 90, 91 of the actuator, moments in the vertical direction and in the horizontal direction are applied to the first contact 42 of the contact pin 40. Their combined moment serves as a rotational force rotating the contact pin around the centers of the first and second elastic members 84, 85. As the first contact portion 42 rotates, it makes a good contact with the bottom of a lead 61, 71 of the integrated circuits 60, 70. At the same time, the first contact portion performs a good wiping action with the bottom of the lead 61, 71. Also, the second contact portion 43 of the contact pin 40 performs a wiping action with respect to the PCB terminal 81 while rotating. As the contact surface of the second contact portion 43 is curved, wiping action at a wide area can be obtained during rotation.

If pressure is applied to the first contact portion 42 of the contact pin 40, the second elastic member receiving portion 44 of the contact pin 40 also applies a pressure to and deforms the second elastic member 85 during the rotation of the contact pin. Thus, the first contact portion may accommodate the pressure applied by the IC leads with elasticity. Thus, deformation or bending of the IC leads can be prevented during test. The present invention is further characterized in that the force required to restore the position of the contact pin 40 after removing the pressure of the actuator is largely obtained from the elasticity of the second elastic member 85. In other words, the first elastic member 84 can be made of a material having a relatively small elasticity. The first elastic member 84 with relatively small elasticity may be used as the rotation axis of the contact pin 40 and a support member as well. Meanwhile, the second elastic member 85 may be made of a material having a relatively great elasticity. The second elastic member 85 is not only used as the rotation axis of the contact pin 40 and a support member but also as an element for providing the elastic force required to restore the position of the contact pin 40 after its rotation movement by means of pressure of the actuator. Therefore, the second elastic member 85 is made of a material with the same length as the first elastic member 84 and having a greater elasticity than the first elastic member 84. For example, the second elastic member 85 may be made of a material such as rubber having an excellent elasticity.

As described above, the present invention has outstanding effects that it can improve a contact quality and reduce inductance of a contact pin. Also, the present invention can reduce the bending of an IC lead that may be caused during testing the integrated circuit. At the same time, present invention effectively extends the life of the contact pin and the entire socket.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed:

1. A socket for testing an integrated circuit, the integrated circuit including a plurality of contact pins for electrically connecting leads of the integrated circuit to terminals of a PCB spaced from the leads of the integrated circuit, the socket comprising:

a contact pin housing installed on said PCB for mounting said integrated circuit, said contact pin housing having a flat top surface and a flat bottom surface and a plurality of slots formed in the top and bottom surfaces, wherein said slots are a uniform size and are formed in locations corresponding to the contact pins of the integrated circuit, such that each contact pin is accommodated by a corresponding slot, said top and bottom surfaces of the contact pin housing being intersected by the slots from the top surface to the bottom surface;

a first channel and a second channel spaced at a predetermined interval in a side wall of each of said slots, such that an axis of said first and second channels is perpendicular to the side wall of said slots, said first and second channels defining identical recesses on the bottom surface of the contact pin housing, said second channel being formed slightly deeper than said first channel;

a first elastic member and a second elastic member respectively installed within said first channel and said second channel;

wherein said contact pins are made of a thin, flat metal piece, a side of said contact pins being generally "W" shaped, such that each of said contact pins engages with said first and second elastic members, and each of said contact pins includes a first contact portion protruding over the top surface of said contact pin housing for making contact with a lead of said integrated circuit and a second contact portion for making contact with one of said terminals of said PCB.

2. The socket for testing an integrated circuit according to claim 1, wherein said first and second elastic members support said contact pins in a position within said slots and serve as a rotation axes of said contact pins when pressure is applied to said first contact portion.

3. The socket for testing an integrated circuit according to claim 2, wherein said second elastic member applies a force to said contact pins to restore the position of said contact pins when said contact pins are rotated by the pressure applied to said first contact portion.

4. The socket for testing an integrated circuit according to claim 1, wherein said second elastic member is made of material having a greater elasticity than said first elastic member.

5. The socket for testing an integrated circuit according to claim 1, said contact pins further comprising:

a first elastic member receiving portion having a circular circumferential face which is open toward and engages with said first elastic member when said contact pins are inserted into said slots;

a second elastic member receiving portion having a circular circumferential face which is open toward and engages with said second elastic member when said contact pins are inserted into said slots, wherein said first elastic member receiving portion and said second elastic member receiving portion are formed on an upper side of said contact pins facing said first and second elastic members when said contact pins are inserted into said slots and said second elastic member is formed at a location opposing said first elastic member with respect to a center of the contact pins;

said first contact portion extends from an outer side of said first elastic member receiving portion with respect to the center of said contact pins and extends generally in a upward direction with respect to the upper side of said contact pins; and said second contact portion is formed on a bottom side of said contact pins opposing the upper side of said contact pins at a location generally below the center of said contact pins.

6. The socket for testing an integrated circuit according to claim 5, wherein said first contact portion extends beyond the upper side of said contact pins.

7. The socket for testing an integrated circuit according to claim 5, wherein said first elastic member receiving portion is formed to gradually widen along a upward direction with respect to said upper side of said contact pins.

8. The socket for testing an integrated circuit according to claim 5, wherein said second contact portion has a curved shape protruding outwardly so that said second contact portion maintains wiping action against said terminals of said PCB in a wide area.

* * * * *